US012774728B2

(12) United States Patent
Shahin

(10) Patent No.: US 12,774,728 B2
(45) Date of Patent: Oct. 27, 2026

(54) CALIPER FOR A DISK BRAKE SYSTEM AND METHOD FOR DESIGNING A CALIPER

(71) Applicant: HL MANDO CORPORATION, Pyeongtaek-si (KR)

(72) Inventor: Hatem Shahin, Pfaffenhofen (DE)

(73) Assignee: HL MANDO CORPORATION, Pyeongtaek-si (KR)

(*) Notice: Subject to any disclaimer, the term of this patent is extended or adjusted under 35 U.S.C. 154(b) by 544 days.

(21) Appl. No.: 18/125,952

(22) Filed: Mar. 24, 2023

(65) Prior Publication Data

US 2023/0304553 A1 Sep. 28, 2023

(30) Foreign Application Priority Data

Mar. 24, 2022 (DE) ......................... 102022202939.9

(51) Int. Cl.

| | |
|---|---|
| ***G06F 30/20*** | (2020.01) |
| ***F16D 65/00*** | (2006.01) |
| ***F16D 65/847*** | (2006.01) |
| *F16D 55/00* | (2006.01) |
| *F16D 65/78* | (2006.01) |

(52) U.S. Cl.

CPC ....... *F16D 65/847* (2013.01); *F16D 65/0068* (2013.01); *G06F 30/20* (2020.01); *F16D 2055/0016* (2013.01); *F16D 2065/789* (2013.01)

(58) Field of Classification Search

CPC .. G06F 30/18; G06F 2113/04; G06F 2111/16; G06F 30/12; G06F 2111/00; G06F 2119/22; H02S 20/23

See application file for complete search history.

(56) References Cited

U.S. PATENT DOCUMENTS

| | | | | |
|---|---|---|---|---|
| 10,487,896 B2 * | 11/2019 | Demorais | ............. | F16D 55/228 |
| 2018/0142746 A1 * | 5/2018 | Hodgkins | .............. | B33Y 80/00 |

FOREIGN PATENT DOCUMENTS

| | | |
|---|---|---|
| DE | 8236515 U1 | 6/1984 |
| DE | 3941876 A1 | 6/1991 |
| DE | 19739122 A1 | 3/1999 |
| DE | 102017125261 A1 | 5/2018 |
| DE | 102018220552 A1 | 6/2020 |
| JP | 6902538 B2 | 7/2021 |

OTHER PUBLICATIONS

A. Belhocine, and M. Bouchetara, "Simulation of fully coupled thermomechanical brake discs", pp. 921-935, 2011 (Year: 2011).*

(Continued)

*Primary Examiner* — Kibrom K Gebresilassie

(74) *Attorney, Agent, or Firm* — LEE, HONG, DEGERMAN, KANG & WAIMEY

(57) ABSTRACT

The invention relates to a caliper for a disk brake system, comprising a housing portion with a cavity for holding a piston, the piston being configured for engaging with a first brake pad, a counter portion configured for holding a second brake pad, a bridge portion connecting the housing portion and the counter portion, wherein the caliper comprises cooling features including at least one protrusion and/or at least one recess, the cooling features being provided on a caliper wall delimiting the cavity and/or on the bridge portion.

9 Claims, 21 Drawing Sheets

(56) References Cited

OTHER PUBLICATIONS

M. Pevec, I. Potrc, G. Bombek and D. Vranesevic, "Prediction of the Cooling Factors of a Vehicle Brake Disc and Its Influence On the Results of a Thermal Numerical Simulation", pp. 725-733, 2012 (Year: 2012).*

Office Action issued in corresponding German Patent Application No. 10 2022 202 939.9 dated Jun. 21, 2022.

* cited by examiner

CALIPER FOR A DISK BRAKE SYSTEM AND METHOD FOR DESIGNING A CALIPER

CROSS-REFERENCE TO RELATED APPLICATION

This application is based on and claims priority under 35 U.S.C. § 119 to German Patent Application No. 102022202939.9, filed on Mar. 24, 2022 in the German Patent and Trade Mark Office, the disclosures of which are incorporated herein by reference.

TECHNICAL FIELD

The present invention is in the field of mechanical engineering. It relates to a caliper for a disk brake system and to a method for designing a caliper for a disk brake system.

BACKGROUND

During braking, kinetic energy of the vehicle is converted into thermal energy absorbed by the brake disk. The heat of the brake disk is transferred to an environment of the brake disk during disk rotation. Some of the heat is transferred to the caliper through air, and some of the heat is transferred through the brake pads, and from there to the piston and the brake fluid, or to the caliper finger.

Disk temperatures may reach 800° C., depending on the type of disk and the size of the car. The temperature of the caliper may reach 400° C., which can lead to a decrease in performance, wherein in particular performance of the brake fluid is affected.

SUMMARY

It is an object of the present invention to improve performance of the brake system by preventing critical portions from overheating.

This is achieved by a caliper according to claim 1 or by a method for designing a caliper according to claim 4. Advantageous embodiments are given in the dependent claims and in the following description and the figures.

Correspondingly, a caliper for a disk brake system comprises a housing portion with a cavity for holding a piston, the piston being configured for engaging with a first brake pad. The caliper further comprises a counter portion configured for holding a second brake pad. The caliper further comprises a bridge portion connecting the housing portion and the counter portion. The caliper comprises cooling features including at least one protrusion and/or at least one recess, the cooling features being provided on a caliper wall delimiting the cavity and/or on the bridge portion. The cooling features may thus be called geometric cooling features.

In particular, cooling features provided on a caliper wall delimiting the cavity may reduce a temperature of the brake fluid and a seal. Cooling features on the bridge portion, similarly, help to prevent heating of the housing portion and thus to prevent heating of the brake fluid. Protrusions may for instance be carried out as ribs.

According to an embodiment, the bridge portion and the counter portion may form a caliper finger of a floating caliper. Alternatively, the counter portion may be a further housing portion of a fixed caliper. In the latter case, the further housing portion may be designed in the same way as the housing portion mentioned above, i.e., it may optionally also comprise cooling features, which may be similar or identical to the cooling features of the first housing portion, or which may be different from them.

In an example, the cooling features are provided on a portion of the caliper wall delimiting the cavity, said portion of the caliper wall being configured to face radially inward when the caliper is mounted in the disk brake system.

The design of the caliper shown and described herein may be the result of the method shown and described herein. The features shown in conjunction with the method may be claimed for the caliper and vice versa.

The method for designing a caliper for a disk brake system uses computer aided optimization (CAO). The method comprises a simulation of mechanical properties and a simulation of thermal properties.

Therein, the mechanical properties and thermal properties are determined for a first model of the caliper, having an initial package volume.

A set of constraints is determined for the mechanical properties.

The mechanical properties and thermal properties are determined for further models of the caliper, the further models having cooling features in predetermined sections of the caliper, the cooling features including at least one protrusion and/or at least one recess.

A final design is selected among the further models, based on the conditions:

(a) the model of the final design meets the constraints for the mechanical properties and (b) the model of the final design shows highest heat transfer to the environment among the further models and/or shows the lowest peak-temperature in a preselected region of the caliper.

For instance, the set of constraints for the mechanical properties may concern

- a minimum stiffness that is desired for the final design and/or
- a minimum strength that is desired for the final design and/or
- a dynamic behaviour that is desired for the final design and/or
- a minimum durability that is desired for the final design and/or
- a minimum and/or a maximum weight that is desired for the final design.

These properties may be modelled in the simulation. It may be envisioned that constraints are defined for one or more of these parameters, in order to ensure that mechanical aspects relevant to the functioning or safety of the caliper are fulfilled.

Constraints may include upper and/or lower boundaries. The constraints may be defined based on the mechanical properties of the first model.

Simulation of mechanical properties may include a simulation of stiffness, in particular a deflection calculation, and/or a simulation of strength, in particular a stress and/or strain calculation, and/or a simulation of dynamic behaviour, in particular an eigenfrequency calculation, and/or a simulation of durability, in particular a fatigue value calculation, and/or a simulation of weight, in particular a mass and/or volume calculation.

The simulation may employ a finite element algorithm, in frequency domain and/or in time domain.

The simulation may comprise initial conditions. The initial conditions may include a temperature distribution, in particular a temperature distribution the brake system, including a brake disk and/or the brake pads. The temperature distribution defined for the brake disk and/or the brake pads corresponds to a possible temperature distribution due to braking.

The simulation of thermal properties may comprise a simulation of conduction and/or convection and/or radiation. Therein, a heat transfer from the brake disk and/or brake pads to the environment, in particular to the surrounding air and to the surrounding components, including the brake fluid, may be modelled.

The simulation of thermal properties may comprise a simulation of heat transfer to an environment. I.e., the a heat transfer from the caliper to the surrounding air (resulting in a cooling of the caliper) may be modelled.

Starting from the above-described initial conditions, taking into account the temperature distribution of all components and the thermodynamic processes, such as conduction, convection and radiation, enables simulation of all relevant thermal properties, such as for instance a temperature distribution over time for a given caliper design (i.e., for the first model and for the further models), allowing for an optimization of a material distribution of the caliper. In other words, the effect of a given set of cooling features that is present in the further models may be analyzed and quantified.

The computer aided optimization allows selection of an optimal material distribution, i.e. selection of an optimal design of the cooling features.

It may be envisioned that the first model is a max-model, having maximum package space. This may correspond to the maximum available space in the brake system. The further models have a reduced volume with respect to the first model. The cooling features are the created by omitting material in the predetermined sections of the caliper, as compared to the max-model.

However, it may also be envisioned that material is sectionally added to the initial model. Then, the further models may in specific areas extend beyond the initial model, their total volume being smaller or larger than that of the further model.

A boundary may be imposed on the weight of the further models. For instance, an upper boundary may be given as +5% or +3% or +0% of the weight of the initial model. A lower boundary may be given as for instance −15% or −10% or −5% of the initial model.

As material is added or removed, according to the various further designs, this may lead to a change in mechanical properties.

As mentioned above, constraints for the mechanical properties may be defined, for instance based on the mechanical properties of the first model. In some cases, there may be a trade-off between one or more of the mechanical properties and the thermal properties.

A multi-target optimization, taking into account thermodynamic and mechanical aspects, is thus performed.

For instance, for forming the cooling features, removal or addition of material is continuously done. As a result, the thermal properties change and, for instance, a desired heat distribution or maximum heat in the preselected region is approached. As long as the mechanical properties are within the constraints, removal or addition of material may continue, until the desired thermal properties are achieved.

For example, a desired output may be a specific temperature distribution for the preselected region. This may include definition of a peak temperature at one or more preselected positions within the preselected region, that should not be exceeded.

Constraints may be upper and/or lower boundary conditions for mechanical properties, such as, for example yield strength and stiffness, which may not be exceeded.

Within the method, the caliper may comprise a housing portion with a cavity for holding a piston, the piston being configured for engaging with a first brake pad, a counter portion configured for holding a second brake pad, And a bridge portion connecting the housing portion and the counter portion, wherein the predetermined sections, where the cooling features are provided, where in particular material is omitted, are a caliper wall delimiting the cavity of the housing portion and/or the bridge portion. Designing the cooling features may be limited to one or both of these pre-determined sections, as they have proven to show a good impact in temperature distribution, and material removal is typically tolerable.

The predetermined section, where the cooling features are provided, in particular material is omitted, may be or may include a portion of the caliper wall that is configured to face radially inward when the caliper is mounted in the disk brake system.

The method may comprise steps of optimizing the further models of the caliper. This may include a topological optimization for identifying an optimal position of the cooling features. Specifically, it may be determined if the cooling features are to be provided in one or both of the above-identified predetermined sections.

The method may include a topographical optimization for identifying an optimal type of cooling features. For instance, protrusions may be formed as ribs. They may extend in axial direction and/or perpendicular to the axial direction.

The method may include a shape optimization for identifying an optimal shape of the cooling features. This may take into account thermal aspects, and it may take into account the available shapes that may be created depending on the type of manufacture, which may for instance include casting and/or additive manufacturing, such as 3D-printing.

The final design may be selected among the further models as the model having the most favourable thermal properties. This choice may be made based on a peak temperature at a position on the caliper wall. In particular, the temperature at a portion of a surface of the caliper wall which limits the cavity for the piston may be considered. This surface may contact the brake fluid and thus contribute to undesired heating of the brake fluid, which should be kept low.

For instance, a target temperature at the surface of the caliper wall may be chosen below 160° C., or below 150° C.

A method may include the above-described method for designing the caliper, in addition to manufacturing the caliper.

BRIEF DESCRIPTION OF DRAWINGS

In the following, the caliper and the method will be exemplarily explained with reference to the appended figures.

Therein.

DETAILED DESCRIPTION

Figure 1:
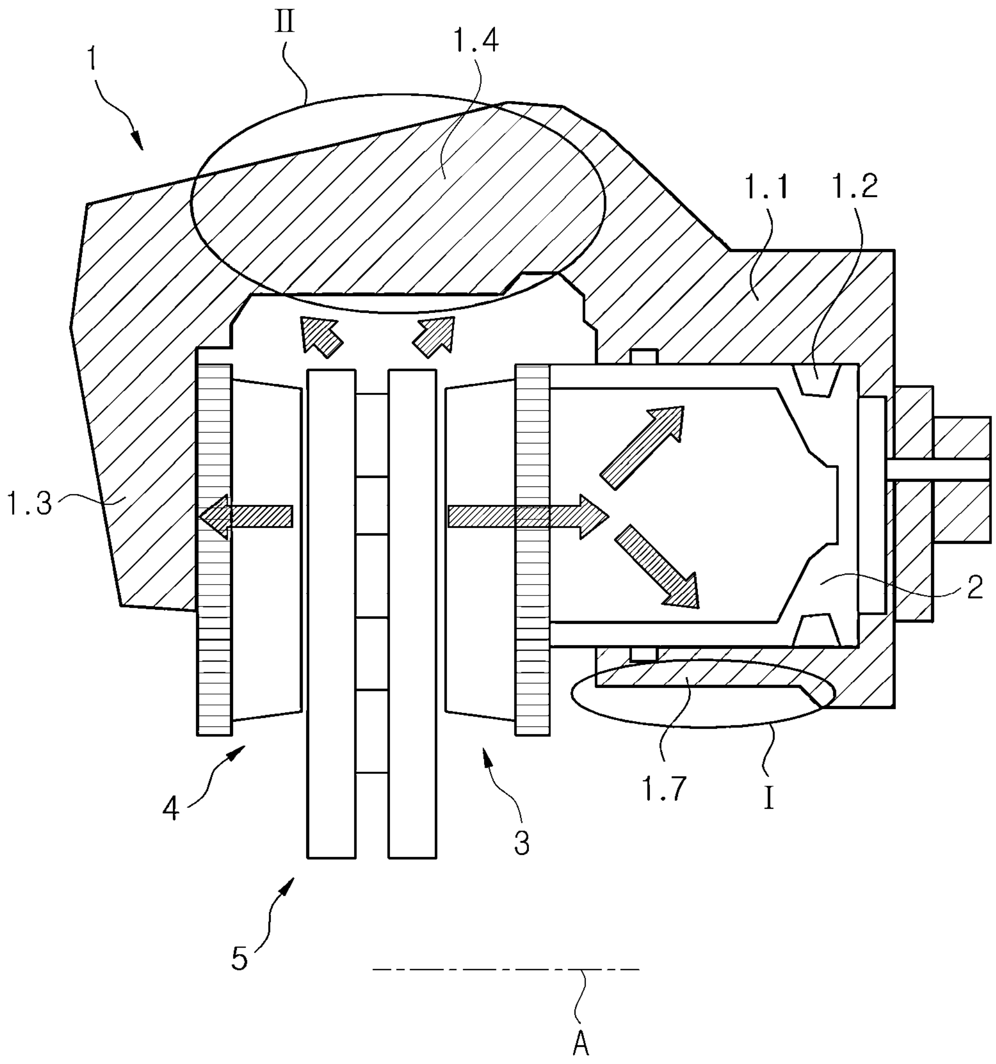
FIGS. 1, 2 illustrate heat transfer in a disk brake system
Figure 2:
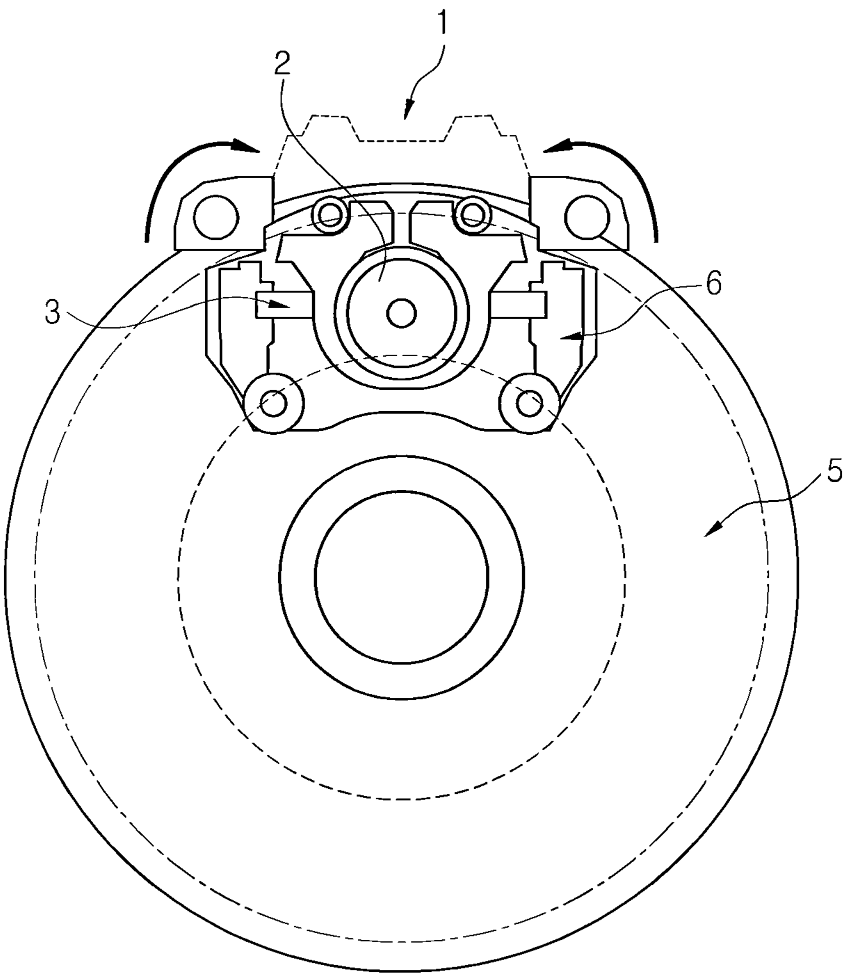

FIG. 1 and b show a disk brake system with a caliper 1 and a brake disk 5. FIG. 1 schematically shows a cut through the brake system, in a plane parallel to axis A of the brake system. FIG. 2 schematically shows a cut through the brake system in a plane that is orthogonal to the axis A.

The caliper comprises a housing portion 1.1 with a cavity 1.2 for holding a piston 2. The piston 2 engages with a first brake pad 3. The housing furthermore comprises a counter portion 1.3 which holds a second brake pad 4, and a bridge portion 1.4 which extends around an outer circumference of the brake disk 5 and connects the housing portion 1.1 and the counter portion 1.3. In the embodiment shown, the caliper 1 is a floating caliper and the bridge portion 1.4 and the counter portion 1.3 form a caliper finger. Alternatively, the counter portion 1.3 may constitute a further housing portion of a fixed caliper.

During braking, the brake pads 3, 4 are pressed against the brake disk 5 and the kinetic energy of the moving vehicle is converted to heat. The brake disk 5 and the brake pads 3, 4 heat up due to friction, and the heat is transferred to the further components of the brake system, via convection, conduction and radiation. As indicated by arrows in FIGS. 1 and 2, heat from the brake disk radiates to the bridge portion 1.4. Furthermore, as indicated by arrows in FIG. 1, heat is transferred from the first brake pad 3 to the piston 2 and into the cavity 1.2. The brake fluid in the cavity 1.2 and a caliper wall 1.7 delimiting the cavity 1.2 heat up due to this process. In particular heating of the brake fluid may negatively affect braking performance.

To limit heating of the caliper, geometric cooling features are provided on the caliper, as will be explained further with reference to FIGS. 3-18. Specifically, for a design process for the caliper, predetermined sections I, II are defined, in which sections the cooling features may be provided. These predetermined sections I, II include a first section of modification I, which comprises a caliper wall 1.7 delimiting the cavity 1.2 of the housing portion 1.1. Furthermore, the predetermined sections I, II include a second section of modification II, which comprises the bridge portion 1.4.

Cooling features are provided in either one or in both of these sections I, II. The position of the cooling features and their design details are determined in a method for designing the caliper. This method employs computer aided optimization (CAO), and it comprises a simulation of mechanical properties and a simulation of thermal properties. The mechanical properties and thermal properties are determined for a first model of the caliper 1, having an initial package volume, which is shown in FIG. 1 and b. A set of constraints is determined for the mechanical properties, which reflect minimum requirements for the caliper 1 that have to be present in the final design.

Further models of the caliper are derived from the first design. Examples of the further models may be derived from FIGS. 5-10 and in FIGS. 12-18, as will be explained below.

The mechanical properties and thermal properties are numerically determined for each further models of the caliper 1, wherein the further models have cooling features in the predetermined sections I, II of the caliper 1, the cooling features including at least one protrusion and/or at least one recess.

A final design is selected among the further models, based on the conditions:

(a) the model of the final design meets the constraints for the mechanical properties and (b) the model of the final design shows highest heat transfer to the environment among the further models and/or shows the lowest peak-temperature in a preselected region of the caliper.

The preselected region may but does not necessarily have to be within one of the predetermined sections I, II. For instance, the preselected region, for which a certain temperature should not be exceeded, may be within the cavity or it may be a surface limiting the cavity. This represents a typical choice within the method, when a given temperature for the brake fluid should not be exceeded.

According to different examples, the cooling features are then provided on a caliper wall 1.7 delimiting the cavity 1.2 and/or on the bridge portion 1.4, as will be explained now with reference to FIGS. 3-18. It is understood that the cooling features of FIGS. 3-18 may be combined with each other.

FIGS. 3-10 focus providing cooling features 1.5 on a caliper wall 1.7 delimiting the cavity 1.2 of the caliper 1.

FIG. 3 once again shows the cut through the brake system, in a plane parallel to the axis A of the brake system. As mentioned in conjunction with FIG. 1, heat is transferred from the brake disk 5 and the brake pad 3 into remaining parts of the brake system. In particular, heat is transferred into the cavity 1.2 of the caliper 1 and to the caliper wall 1.7 delimiting the cavity 1.2. On a bottom side of the cavity 1.2, facing radially inward towards the axis A, a portion of the caliper wall 1.7 delimits the cavity 1.2. This portion of the caliper wall 1.7, which faces radially inward when the caliper 1 is mounted in the disk brake system, heats up due to radiation, conduction and convection. A temperature distribution along this portion of the caliper wall 1.7, along the arrow, is shown in FIG. 4. Therein, curve i) depicts an initial temperature distribution along the arrow of FIG. 3, i.e., on a line of the surface delimiting the cavity 1.2. The initial temperature distribution i) is computed for a first model of the caliper 1, which has no cooling features. This initial temperature distribution leads to strong heating of the brake fluid that is contained in the cavity 1.2, which shall be prevented. Therefore, heat transfer in the axial direction, along the arrow should be minimized. For example, a target heat distribution along the said line of the surface delimiting the cavity 1.2 is given by curve ii). Therein, heat transfer to the portions of the wall 1.7 that are axially away from the brake disk 5 is suppressed. This may be achieved by having geometric cooling features 1.5 at this wall 1.7, within the predetermined section of modification I. Material indicated by a white box on the bottom of the wall 1.7 marks a maximum available design space for providing the geometric cooling features 1.5. I.e., during the design procedure, according to the various further designs, material is omitted from the region marked by the white box, to form the cooling features 1.5. For each further design, with its specific configuration of cooling features 1.5, the thermal and mechanical properties are modelled once again, to ensure that the mechanical constraints are met, as the target temperature distribution ii) is approached. Thermal modelling includes a simulation of conduction, convection and radiation. In the example of FIG. 4, a target temperature at the surface of the caliper wall at the end of curve ii) is set to below 150° C.

For each of the further models of FIGS. 5-10, the cooling features 1.5 are provided on a portion of the caliper wall 1.7 delimiting the cavity 1.2, said portion of the caliper wall 1.7 being configured to face radially inward when the caliper 1 is mounted in the disk brake system.

Figure 3:
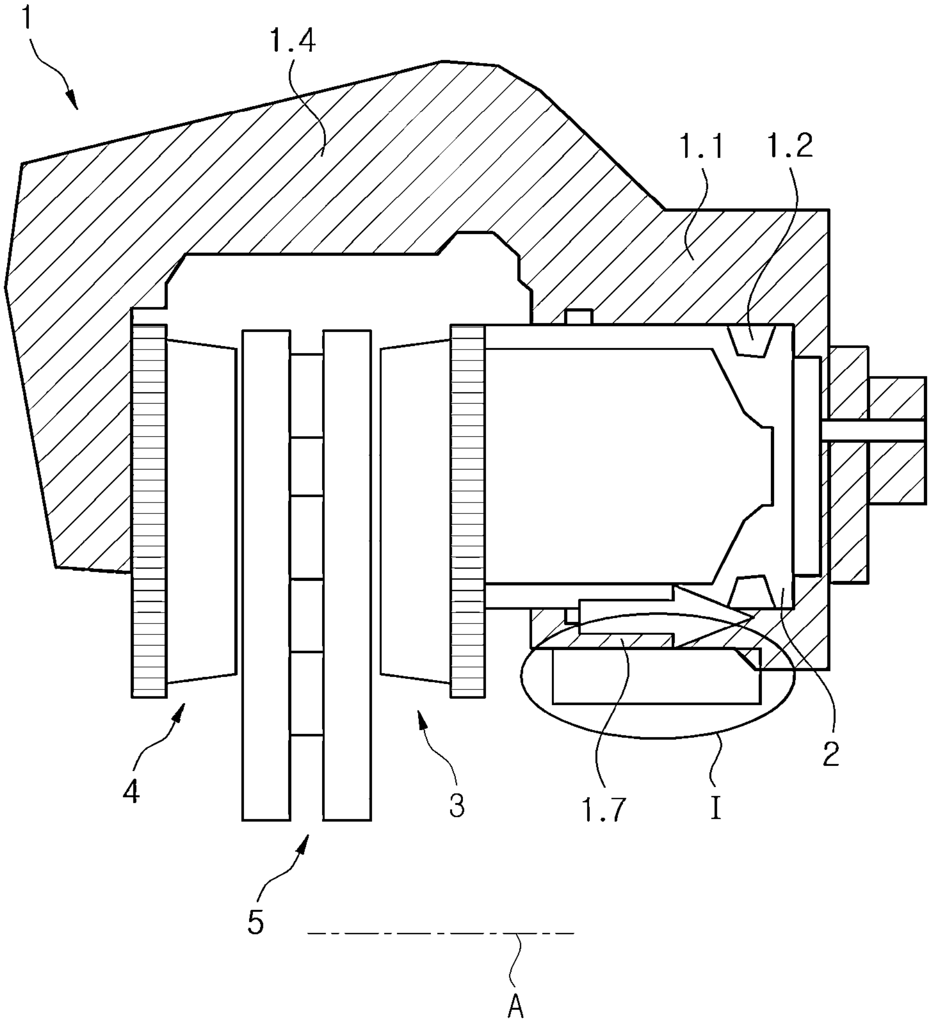
FIG. 3 indicates a first section of modification in a caliper.
Figure 4:
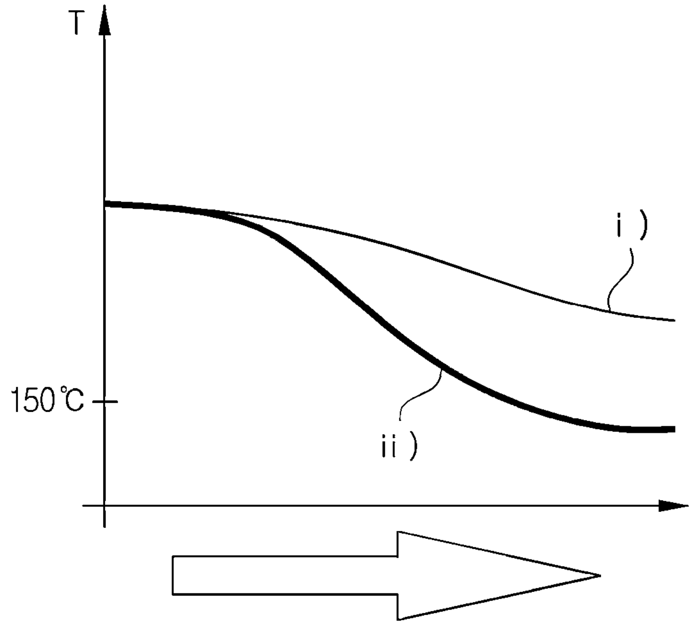
FIG. 4 shows a temperature distribution within the caliper, along an axial direction.

Each of the further models of FIGS. 5-10 have a reduced volume with respect to the first model of FIG. 3, wherein the cooling features are designed by omitting material in the predetermined section II of the caliper, namely from the region marked by the white box.

Figure 5:
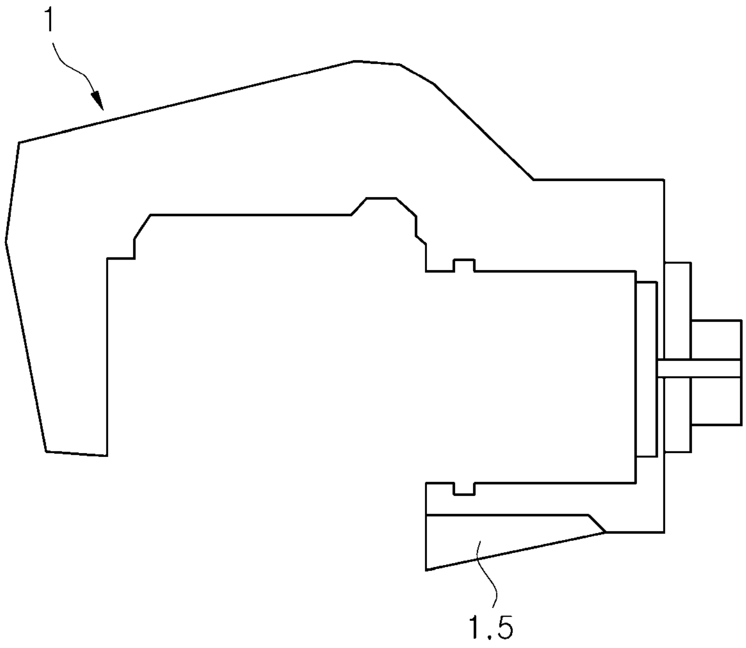
FIGS. 5-10 show design options for a caliper with reduced heat transfer in axial direction, FIG. 11 indicates a second section of modification in a caliper.

FIG. 5 shows a model, wherein the cooling features 1.5 include one or more ribs extending along the axial direction, the one or more ribs having decreasing thickness along the axial direction, away from the brake disk 5.

Figure 6:
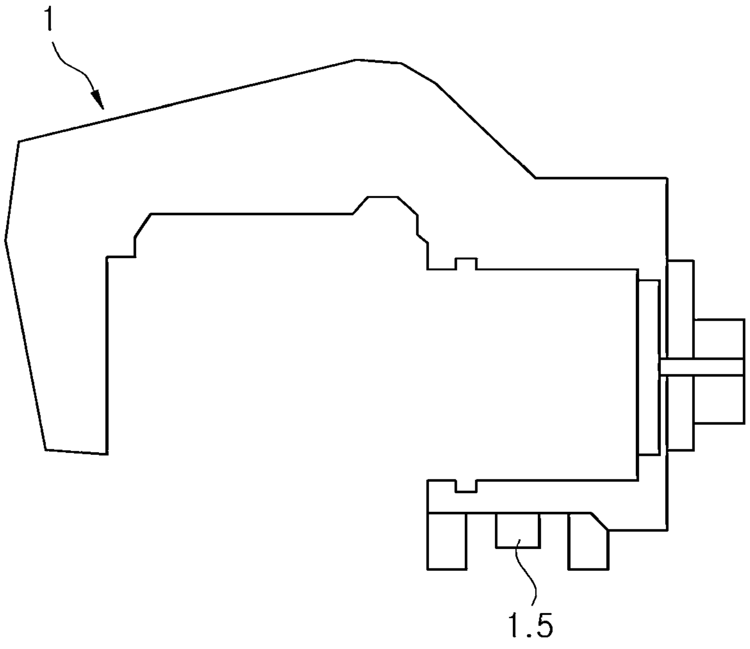

FIG. 6 shows a model, wherein the cooling features 1.5 include three ribs extending orthogonal to the axial direction, a first and a third rib being higher than a central rib. Recesses between the ribs can be seen.

Figure 7:
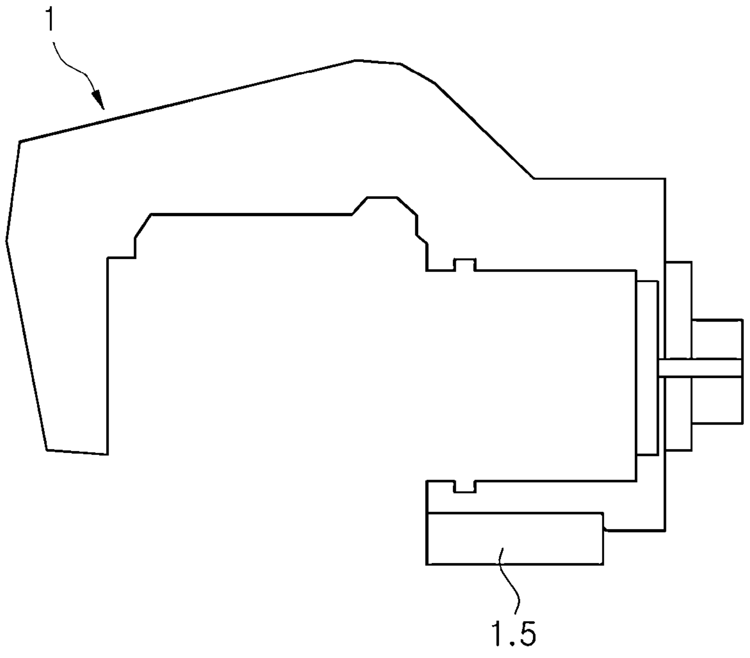

FIG. 7 shows a model, wherein the cooling features 1.5 include one or more ribs of constant height, extending along the axial direction.

Figure 8:
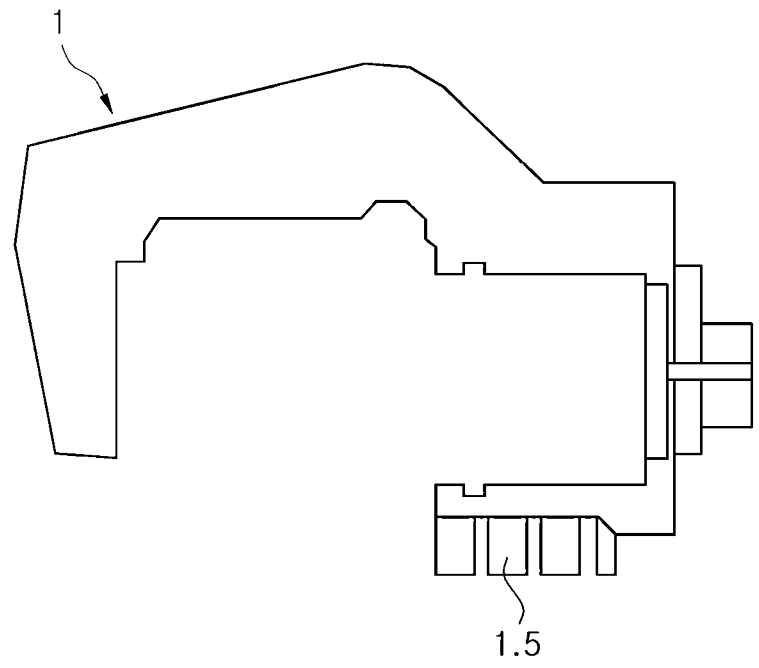

FIG. 8 shows a model wherein the cooling features 1.5 include four ribs of varying thickness, extending orthogonal to the axial direction.

Figure 9:
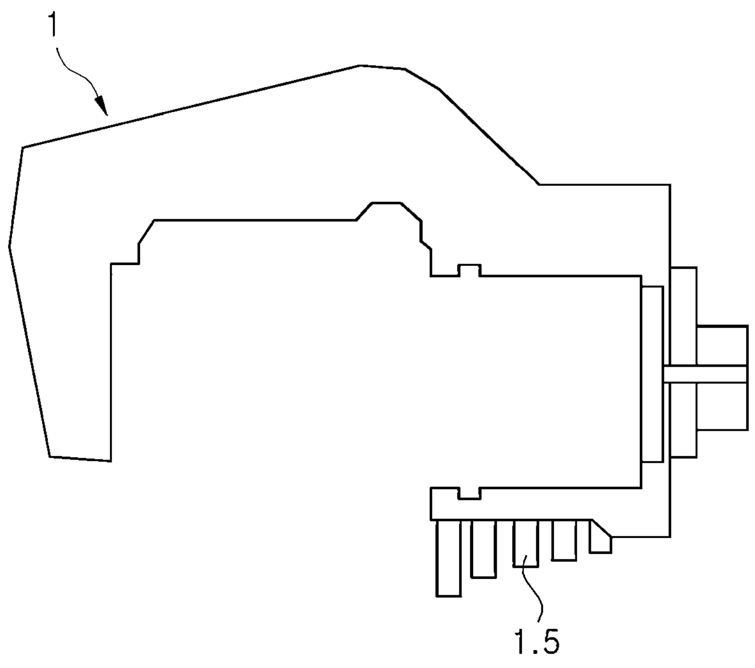

FIG. 9 shows a model wherein the cooling features 1.5 include five ribs extending orthogonal to the axial direction, heights of the ribs being different from each other, decreasing in the axial direction.

Figure 10:
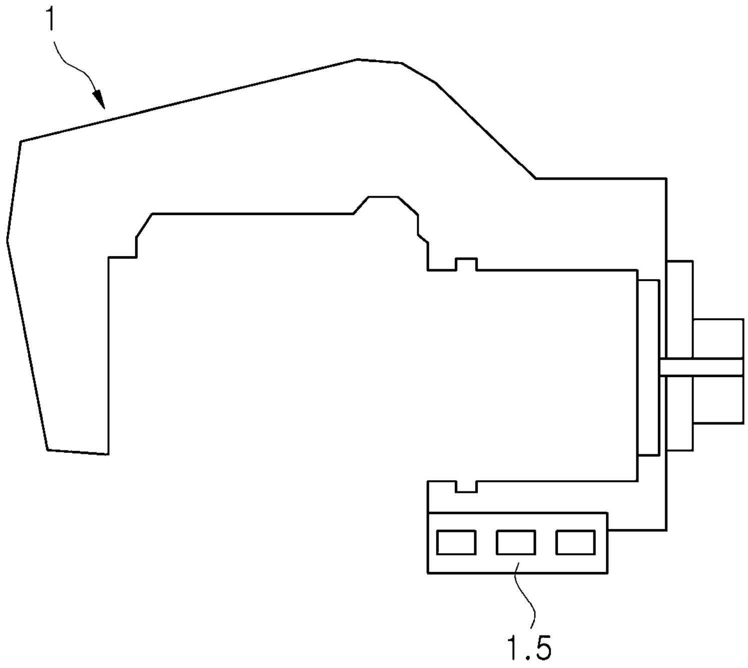

FIG. 10 shows a model wherein the cooling features 1.5 include three recesses extending orthogonal to the axial direction.

With reference to all of FIGS. 3-10, merely as an example for illustrating the method, for a given material, it may for instance be determined during the simulation that out of models 5-10, models 7 and 10 do not meet the thermal requirements of curve ii), and it may be determined that models 6, 8 and 9 do not meet the mechanical requirements, whereas model 5 meets both thermal and mechanical requirements and is consequently selected.

FIGS. 11-18 focus providing cooling features 1.5 on the bridge portion 1.4 of the caliper 1.

FIG. 11 once again shows the cut through the brake system, in a plane parallel to the axis A of the brake system. As mentioned in conjunction with FIG. 1, heat is transferred from the brake disk 5 and the brake pad 3 into remaining parts of the brake system, including the bridge portion 1.5.

According to an example of the method shown herein, a second section of modification II may be envisioned on the bridge portion 1.5. In further models of the brake caliper 1, cooling features 1.6 are provided in the second section of modification II, and, as in the case of FIGS. 3-10, their influence on the mechanical and thermal properties is modelled and finally one of the further models is selected.

Figure 12:
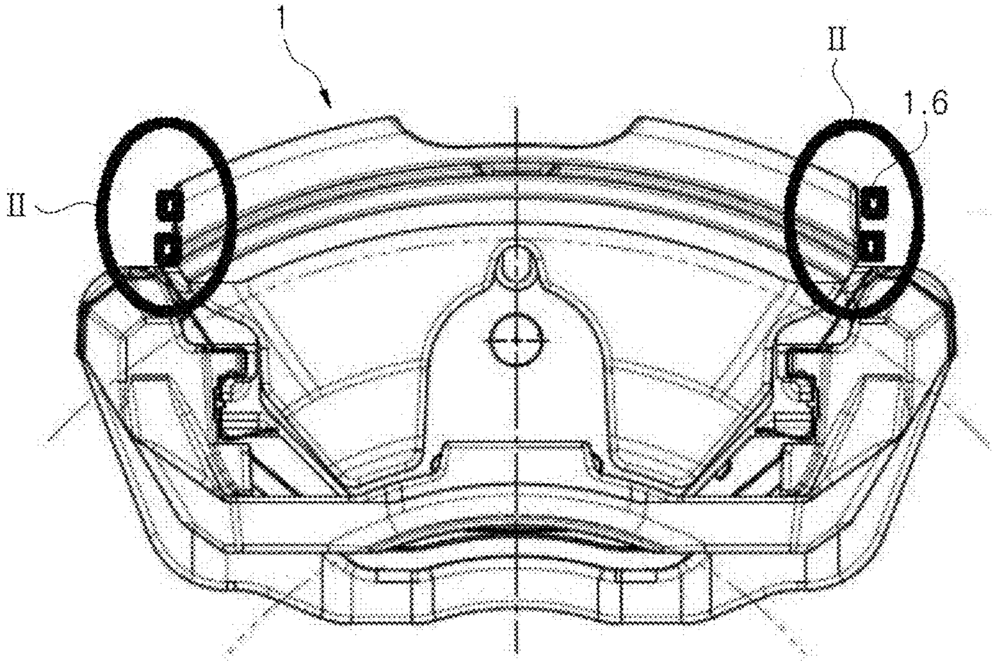
FIGS. 12-18 show design options for a caliper with reduced heat transfer through a bridge portion of the caliper.
Figure 13:
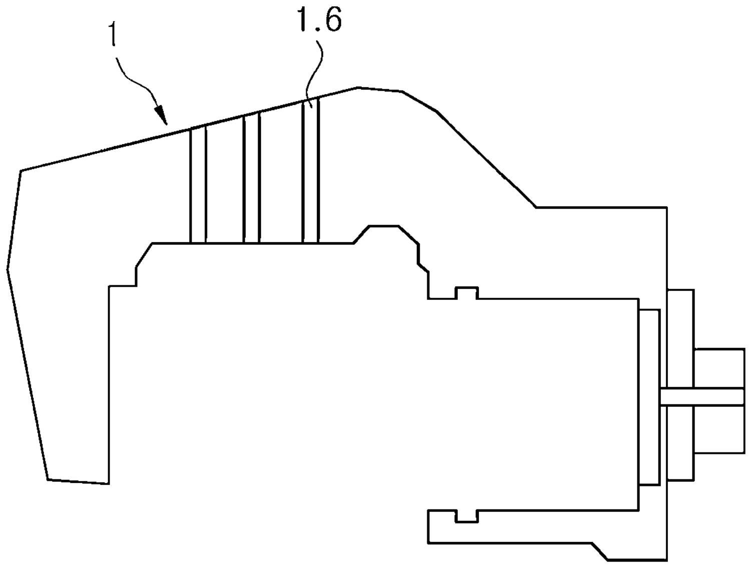
Figure 14:
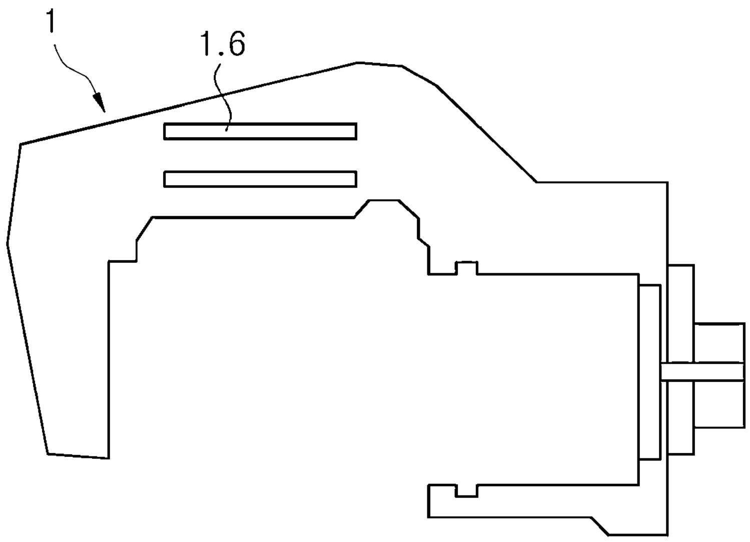
Figure 15:
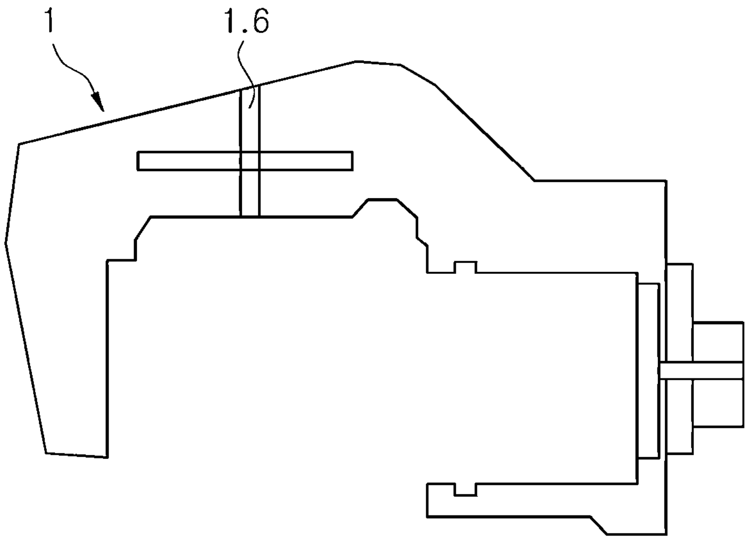
Figure 16:
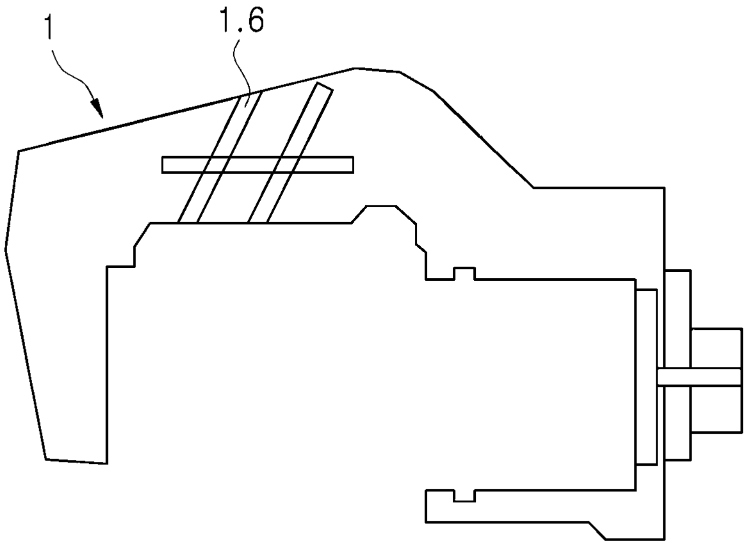

FIG. 12 shows a view along the axis A of the brake system, wherein the second section of modification II can be seen from a different perspective. Accordingly, geometric cooling features 1.6 can be provided on either side of the bridge portion.

Figure 11:
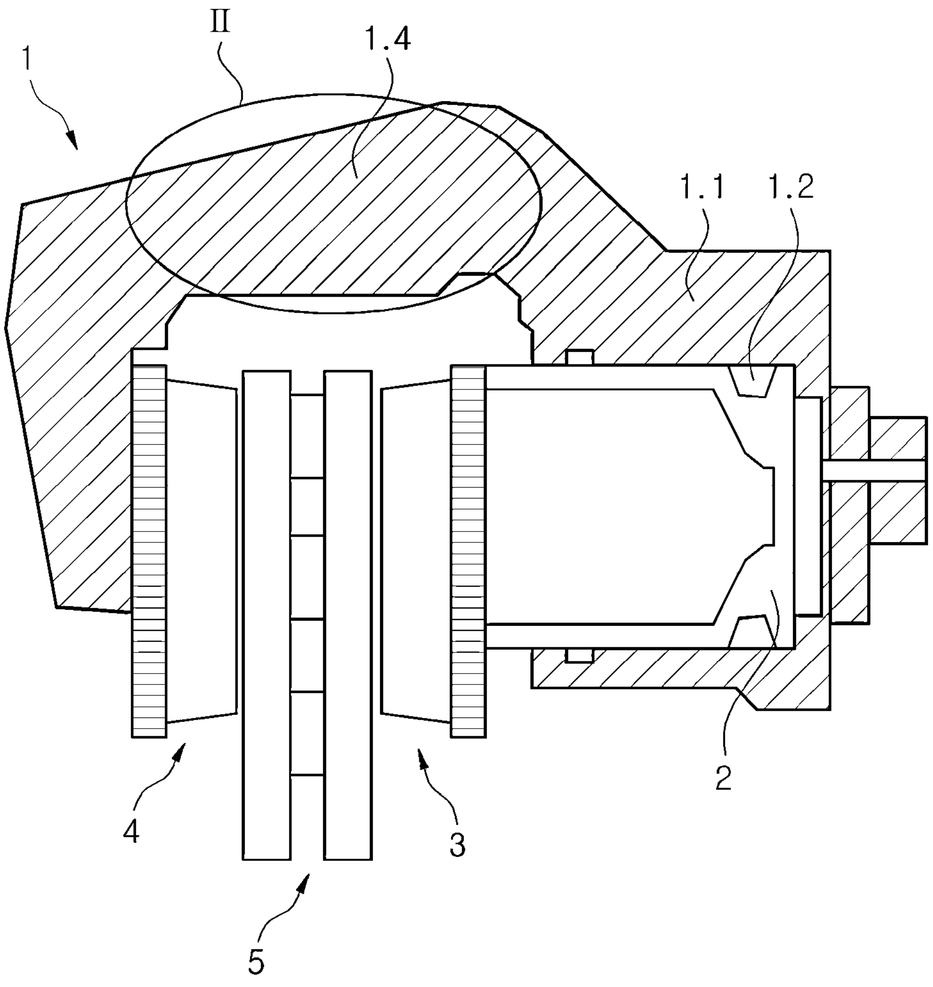
Figure 17:
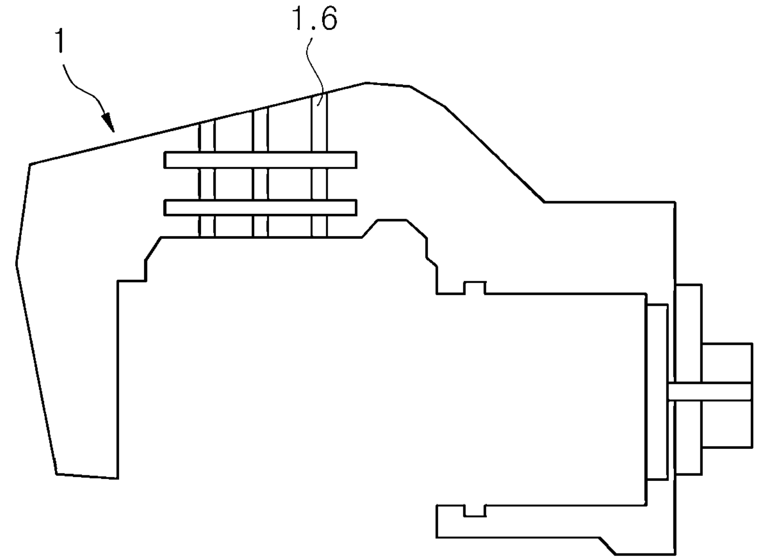
Figure 18:
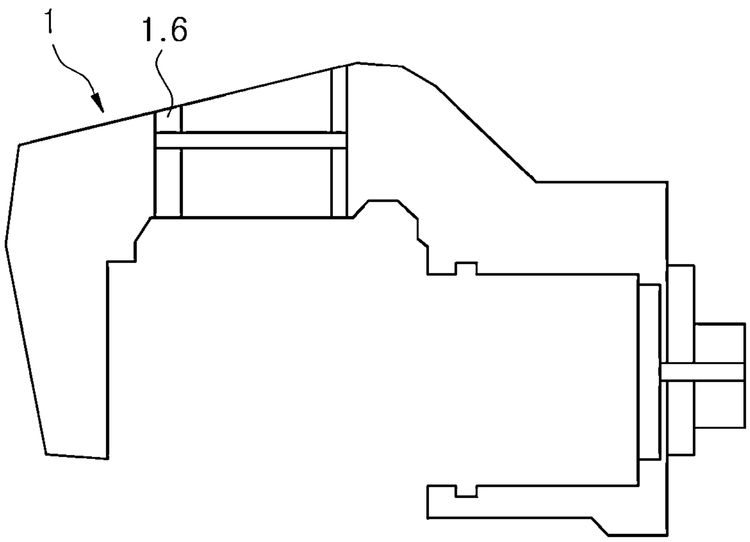

FIGS. 13-18 show the cooling features 1.6 again in the perspective that is also shown in FIG. 11. The cooling features 1.6 in each case comprise ribs, extending in a horizontal and/or in a vertical direction. FIG. 17, for example, shows both horizontal and vertical ribs, the horizontal ribs of this model also being shown in FIG. 12.

Figure 19:
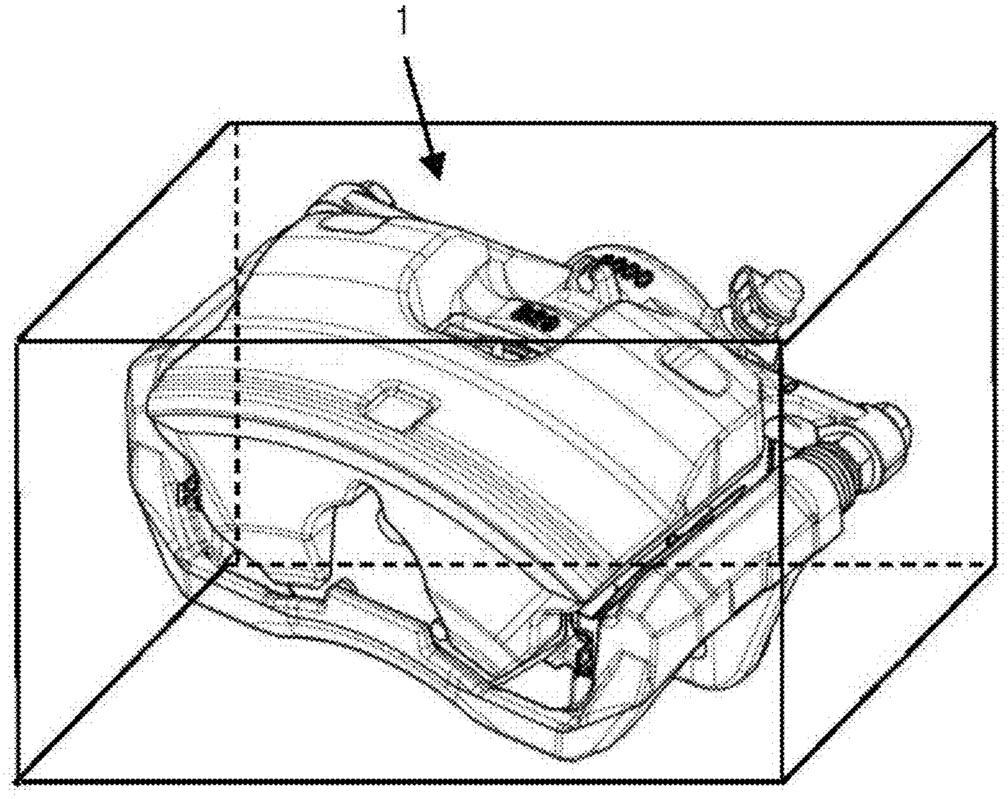
FIGS. 19-21 illustrate a design process for the caliper.
Figure 20:
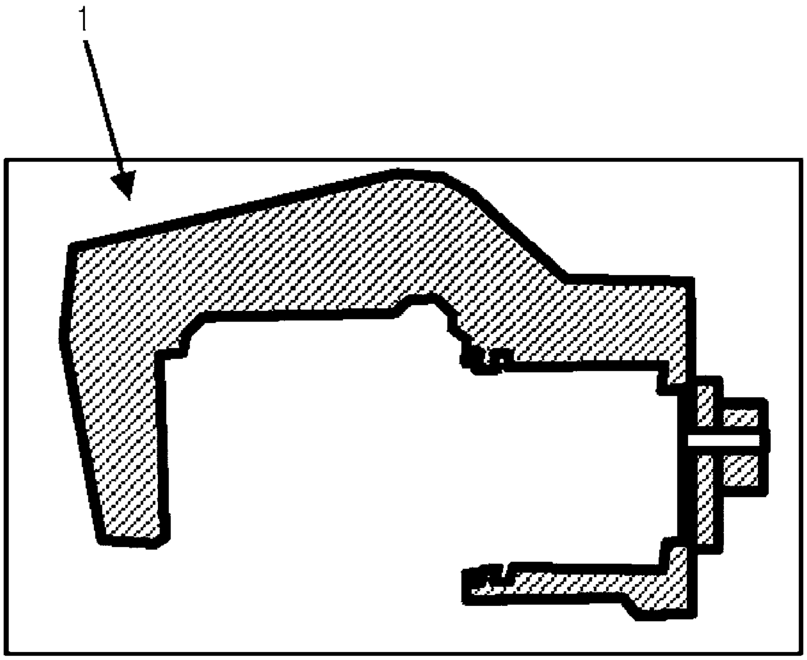
Figure 21:
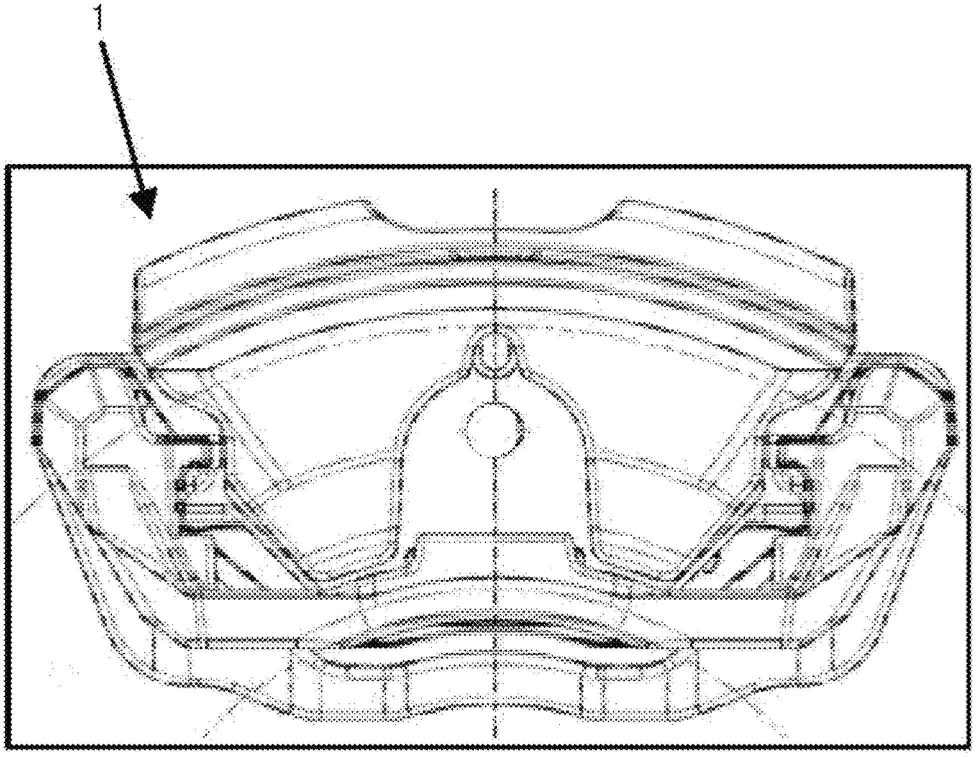

Turning to FIGS. 19-21, aspects of the simulation are further discussed. FIG. 19 shows a 3D-design space which is used in the simulation, and FIGS. 20 and 21 show 2D design areas under consideration. The full 3D model of FIG. 19 represents a maximum package available for designing the caliper 1. Thermal and mechanical properties are numerically determined and observed in the planes of FIGS. 20 and 21 do determine suitability of the various further models, which have cooling features 1.5, 1.6 as indicated in FIGS. 3-18. As explained above, predetermined sections I, II, where the cooling features 1.5, 1.6 are provided, are a caliper wall 1.7 delimiting the cavity 1.2 of the housing portion 1.1 and the bridge portion 1.4.

In a multi target optimization, an optimal design for the caliper 1 is determined.

Heat transfer to an environment, for instance a heat flux through the surfaces of the caliper designs may be modelled to determine suitability of the model.

Moreover, the simulation of mechanical properties includes a simulation of stiffness, in particular a deflection calculation, and/or a simulation of strength, in particular a stress and/or strain calcula-tion, and/or a simulation of dynamic behaviour, in particular an eigenfrequency calculation, and/or a simulation of durability, in particular a fatigue value calculation, and/or a simulation of weight, in particular a mass and/or volume calculation.

The method further comprises steps of optimizing the further models of the caliper 1. This includes topological optimization for identifying an optimal position of the cooling features (such as on the bridge 1.4 and/or on the caliper wall 1.7), topographical optimization for identifying an optimal type of cooling features (recesses and/or protrusions), shape optimization for identifying an optimal shape of the cooling features (e.g. detailed features such as rounded edges etc.).

The final design is selected among the various further models, based on a peak temperature and temperature distribution at predetermined portions of a surface of the caliper wall 1.7 which limits the cavity 1.2 for the piston 2.

What is claimed is:

1. A method for designing a caliper for a disk brake system using computer aided optimization (CAO) executed by a computer system, the method comprising a simulation of mechanical properties and a simulation of thermal properties performed using a finite element model of the caliper, wherein the mechanical properties and thermal properties are determined for a first model of the caliper, having an initial package volume, a set of constraints is determined for the mechanical properties, the mechanical properties and thermal properties are determined for further models of the caliper, the further models having cooling features in predetermined sections of the caliper, the cooling features including at least one protrusion and/or at least one recess, wherein a final design is selected by the computer system among the further models, based on the condition:

(a) the model of the final design meets the constraints for the mechanical properties and (b) the model of the final design shows highest heat transfer to the environment among the further models and/or shows the lowest peak-temperature in a preselected region of the caliper determined from the thermal simulation, and outputting, by the computer system, geometric design data of the final design for manufacturing the caliper, wherein the caliper comprises a housing portion with a cavity for holding a piston, the piston being configured for engaging with a first brake pad, a counter portion configured for holding a second brake pad, and a bridge portion connecting the housing portion and the counter portion, wherein the predetermined sections, where the cooling features are provided, where material is omitted, are a caliper wall delimiting the cavity of the housing portion and/or the bridge portion.

2. The method according to claim 1, wherein the further models have a reduced volume with respect to the first model, wherein the cooling features are designed by automatically removing material in the predetermined sections of the caliper using the computer system.

3. The method according to claim 1, wherein the simulation of thermal properties comprises a simulation of conduction and/or convection and/or radiation.

4. The method according to claim 1, wherein the simulation of thermal properties comprises a simulation of heat transfer to an environment.

5. The method according to claim 1, wherein the simulation of mechanical properties includes a simulation of stiffness, a deflection calculation, and/or a simulation of strength, a stress and/or strain calculation, and/or a simulation of dynamic behavior, an eigenfrequency calculation, and/or a simulation of durability, a fatigue value calculation, and/or a simulation of weight, a mass and/or volume calculation.

6. The method according to claim 1, wherein the predetermined section, where the cooling features are provided, is or includes a portion of the caliper wall that is configured to face radially inward when the caliper is mounted in the disk brake system.

7. The method according to claim 1, comprising steps of optimizing the further models of the caliper, including topological optimization for identifying an optimal position of the cooling features, topographical optimization for identifying an optimal type of cooling features, shape optimization for identifying an optimal shape of the cooling features.

8. The method according to claim 1, wherein the final design is selected among the further models, based on a peak temperature at a portion of the caliper wall, at a portion of a surface of the caliper wall which limits the cavity for the piston.

9. The method according to claim 8, wherein a target temperature at the surface of the caliper wall is below 160° C.

* * * * *